United States Patent [19]
Janai et al.

[11] Patent Number: 5,541,814
[45] Date of Patent: Jul. 30, 1996

[54] PERSONALIZABLE MULTI-CHIP CARRIER INCLUDING REMOVABLE FUSES

[75] Inventors: Meir I. Janai; Zvi Orbach, both of Haifa, Israel

[73] Assignee: Quick Technologies Ltd., Haifa, Israel

[21] Appl. No.: 133,373

[22] Filed: Oct. 8, 1993

[51] Int. Cl.$^6$ ............................ H05K 1/11; H01R 9/09
[52] U.S. Cl. ................. 361/778; 174/261; 174/255; 257/209; 257/211; 257/529; 257/530; 361/760; 361/777; 361/779
[58] Field of Search ...................... 174/250, 253, 174/255, 260, 261, 262; 257/700, 701, 702, 724, 725; 361/748, 760, 767, 771, 774, 777, 778, 779, 781, 792, 793, 795, 807, 808, 809, 805; 428/901; 439/44, 47, 48, 49, 65, 68, 69, 74

[56] References Cited

U.S. PATENT DOCUMENTS

| | | | |
|---|---|---|---|
| 4,875,971 | 10/1989 | Orbach et al. | 156/644 |
| 4,924,287 | 5/1990 | Orbach et al. | 257/205 |
| 4,933,738 | 6/1990 | Orbach et al. | 257/205 |
| 4,974,048 | 11/1990 | Chakravorty | 257/786 |
| 5,049,969 | 9/1991 | Orbach et al. | 257/205 |
| 5,111,273 | 5/1992 | Orbach et al. | 257/209 |

FOREIGN PATENT DOCUMENTS 63-213399  6/1988  Japan .................................... 361/778

OTHER PUBLICATIONS

"MCC and MicroModule Systems Bring Rapid Prototyping to MCM Market", MCC Microelectronics and Computer Technology Corp.

H. Muller et al, "Very Fast Prototyping of Multi–Chip Module Substrates", Microelectronics and Computer Technology Corp.

MCC Rapid Multichip Module Prototyping.

Albert A. Bogdan, "An Electrically Programmable Silicon circuit Board", Proc. BUSCON 1987. p. 156 ff.

"Programmable Silicon Circuit Boards for High Density Packagin Semiconductor International", Nov. 1987, p. 32.

Primary Examiner—Donald A. Sparks
Attorney, Agent, or Firm—Browdy and Neimark

[57] ABSTRACT

A personalizable multi-chip carrier including a substrate, first and second pluralities of conductors arranged on respective first and second parallel planes, the first and second pluralities of conductors defining a grid of conductors arranged over the substrate and defining a multiplicity of crossing locations at which conductors of the first and second pluralities cross each other, apparatus for interconnecting the first and second pluralities of conductors at locations adjacent the multiplicity of crossing locations and including a plurality of fusible links.

5 Claims, 6 Drawing Sheets

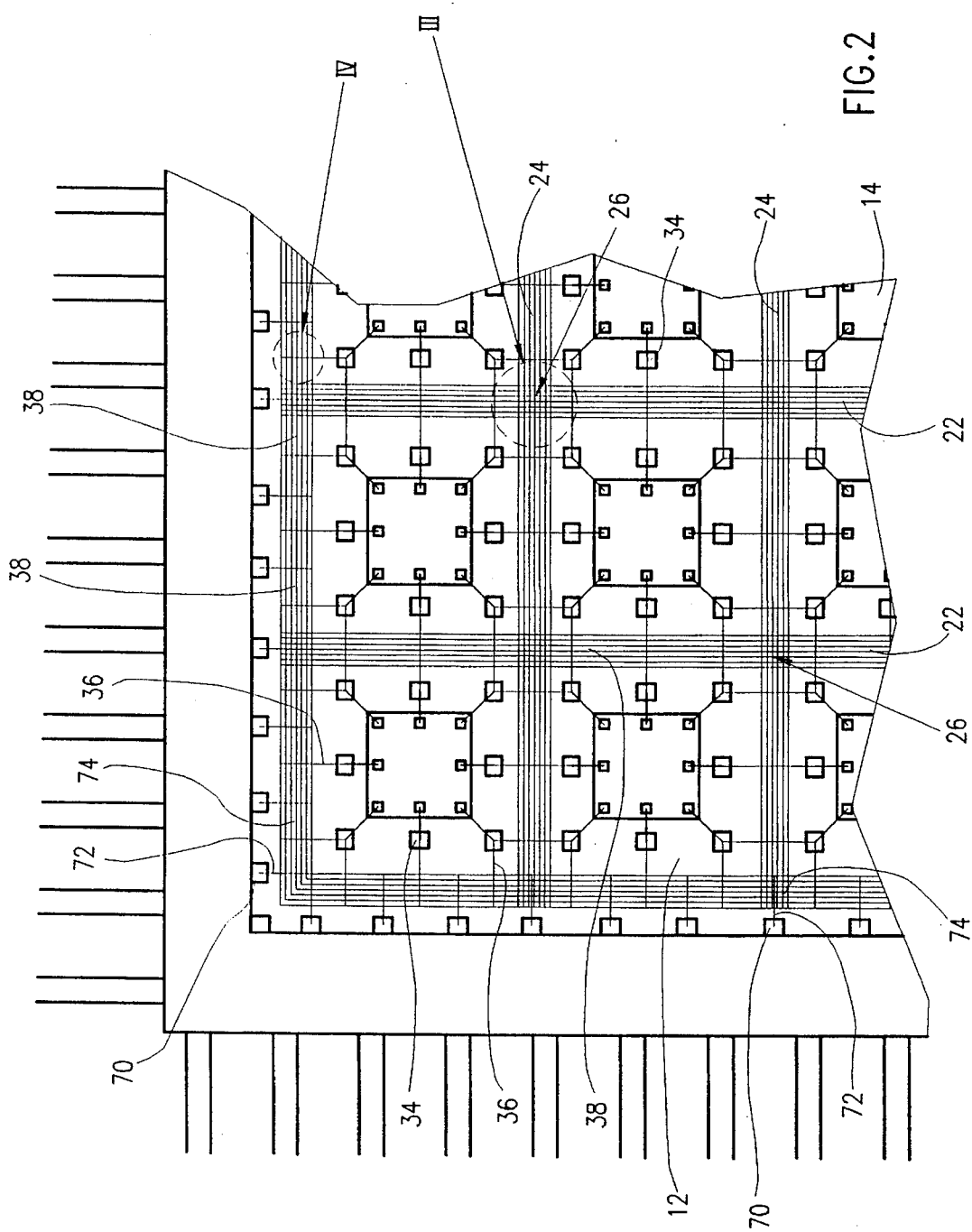

PERSONALIZABLE MULTI-CHIP CARRIER INCLUDING REMOVABLE FUSES

FIELD OF THE INVENTION

The present invention relates to multi-chip carriers generally and to methods for manufacture thereof.

BACKGROUND OF THE INVENTION

In recent years, the desirability of packaging several integrated circuit chips within a single package or compact module has been appreciated. The resulting package provides relatively complex electronic functions as well as improved performance, enhanced density and shortened interconnect lines.

Such packages generally comprise multi-chip carriers, which include a substrate for supporting the chips and on which is formed a high density interconnect grid, which provides interconnection between pads of the various chips and also provides a connection to leads at the periphery of the package.

The chips are bonded to the substrate. The electrical connections between the multi-chip carrier and the chip pads as well as between the carrier and the package-leads are established by using suitable existing technologies, such as wire bonding, tape automated bonding, laser interconnect deposition and flip-chip bump bonding. Passive elements such as capacitors and inductors may also be mounted on the substrate.

The manufacture of multi-chip carriers normally involves the deposition onto a substrate and patterning of four different metal layers, having four different insulation layers therebetween.

A typical manufacturing sequence is summarized hereinbelow:

A first metal layer, which may serve as a ground plane, is deposited on a substrate such as a glass plate, a ceramic plate or a silicon wafer.

A first insulation layer, such as polyimide or glass, is deposited over the first metal layer. Standard photolithography and etching techniques are employed to define vias through the insulation layer for connecting upper layers to the ground plane.

A second metal layer is deposited over the first insulation layer. This layer may serve as the power plane. Standard photolithography and etching techniques are employed to isolate the ground plane from the power plane by etching the metal around the previously formed vias.

A second insulation layer is deposited over the second metal layer. Standard photolithography and etching techniques are employed to define vias for connections of upper layers to the ground plane and power plane.

A third metal layer is deposited over the second insulation layer and patterned to form a bottom signal plane.

A third insulation layer is deposited over the third metal layer and patterned to define vias for connection to the underlying metal layers.

A fourth metal layer is deposited over the third insulation layer and patterned to form an upper signal plane which usually includes bonding pads by which the multi-chip carrier will be connected to the chips and to the package leads.

A fourth insulation layer is deposited over the fourth metal layer and patterned to define openings for the bonding pads.

The above-summarized process is long and costly and the product produced thereby is specific to a given application, such that each application requires a custom-made carrier.

An electrically programmable multi-chip carrier is described in an article entitled "Programmable Silicon Circuit Boards for High Density Packaging" in Semiconductor International, November 1987, page 32. This chip carrier is also described in an article entitled "An electrically programmable silicon circuit board," by Albert A. Bogdan, Proc. BUSCON'87 pp 156 ff.

SUMMARY OF THE INVENTION

The present invention seeks to provide a customizable multi-chip carrier whose performance and flexibility exceed those of prior art devices.

There is thus provided in accordance with a preferred embodiment of the present invention a personalizable multi-chip carrier including:

a substrate;

first and second pluralities of conductors arranged on respective first and second parallel planes, the first and second pluralities of conductors defining a grid of conductors arranged over the substrate and defining a multiplicity of crossing locations at which conductors of the first and second pluralities cross each other;

apparatus for interconnecting the first and second pluralities of conductors at locations adjacent the multiplicity of crossing locations;

a first selectably removable fuse formed on at least one of the first and second pluralities of conductors adjacent each of the multiplicity of crossing locations;

a third plurality of chip connection pads located alongside at least one of the first and second pluralities of conductors;

a fourth plurality of electrical connectors connecting each of the third plurality of chip connection pads to a fifth plurality of conductors forming part of the grid of conductors; and a second selectably removable fuse between each of the fourth plurality of electrical connectors and each of the third plurality of chip connection pads.

In accordance with one embodiment of the present invention, the chip connection pads lie in one of said first and second parallel planes. Alternatively, the chip connection pads may lie in another plane.

Preferably, the multi-chip carrier also includes a ground plane disposed over the substrate and in a plane parallel to, different from and electrically insulated from the first and second parallel plates and apparatus for conductively connecting the ground plane to some of the third plurality of chip connection pads.

Additionally in accordance with a preferred embodiment of the present invention, the multi-chip carrier also includes a third selectably removable fuse disposed along the apparatus for conductively connecting the ground plane to some of the third plurality of chip connection pads.

In accordance with a preferred embodiment of the invention, the multi-chip carrier also includes a power plane disposed over the substrate and in a plane parallel to, different from and electrically insulated from the first and second parallel planes and apparatus for conductively connecting the power plane to some of the third plurality of chip connection pad.

Further in accordance with a preferred embodiment of the invention, the multi-chip carrier also includes:

a sixth plurality of lead connection pads adjacent at least one of the first and second pluralities of conductors; and a seventh plurality of electrical connectors connecting each of the sixth plurality of lead connection pads to an eighth plurality of conductors forming part of the grid of conductors;

Further in accordance with a preferred embodiment of the present invention there is provided a multi-chip carrier including a blank including at least a first metal layer and a second metal layer formed over the first metal layer and separated therefrom by an insulator, the first and second metal layers including chip connection pads and conductor grids and portions arranged for selectable removal to provide desired customization of the blank, the insulator being formed with openings overlying regions of the first metal layer to be selectably removed.

Additionally in accordance with a preferred embodiment of the present invention there is provided a technique for production of customized multi-chip carriers including the steps of:

providing a multi-chip carrier blank having at least a first metal layer and a second metal layer formed over the first metal layer and separated therefrom by an insulator, the first and second metal layers including chip connection pads and conductor grids and portions interconnecting the chip connection pads and the conductor grids arranged for selectable removal to provide desired customization of the multi-chip carrier blank; and thereafter customizing the electrical connections between the chip connection pads and the conductor grids in the multi-chip carrier blank by selective removal of portions of at least the first metal layer.

Preferably, the step of customization includes the step of laser ablation of the portions of at least the first metal layer.

In accordance with a preferred embodiment of the present invention the step of customization includes the step of etching of the portions of at least the first metal layer.

Further in accordance with a preferred embodiment of the present invention there is provided a technique for production of customized multi-chip carriers including the steps of:

providing a multi-chip carrier blank having at least one metal layer;

first etching the at least one metal layer to define chip connection pads and conductor grids and portions interconnecting the chip connection pads and the conductor grids arranged for selectable removal to provide desired customization of the multi-chip carrier blank; and etching the at least one metal layer a second time to customize the electrical connections between the chip connection pads and the conductor grids in the multi-chip carrier blank by selective removal of portions of at least the one metal layer.

Additionally in accordance with a preferred embodiment of the present invention there is provided a multi-chip carrier formed in accordance with a technique for production of customized multi-chip carriers including the steps of:

providing a multi-chip carrier blank having at least one metal layer;

first etching the at least one metal layer to define chip connection pads and conductor grids and portions interconnecting the chip connection pads and the conductor grids arranged for selectable removal to provide desired customization of the multi-chip carrier blank; and etching the at least one metal layer a second time to customize the electrical connections between the chip connection pads and the conductor grids in the multi-chip carrier blank by selective removal of portions of at least the one metal layer.

Further in accordance with a preferred embodiment of the present invention there is provided a multi-chip carrier formed in accordance with a technique for production of customized multi-chip carriers including the steps of:

providing a multi-chip carrier blank having at least a first metal layer and a second metal layer formed over the first metal layer and separated therefrom by an insulator, the first and second metal layers including chip connection pads and conductor grids and portions interconnecting the chip connection pads and the conductor grids arranged for selectable removal to provide desired customization of the multi-chip carrier blank; and thereafter customizing the electrical connections between the chip connection pads and the conductor grids in the multi-chip carrier blank by selective removal of portions of at least the first metal layer.

A multi-chip module produced in accordance with the above technique and incorporating the above-described multi-chip module is also provided.

BRIEF DESCRIPTION OF THE DRAWINGS

The present invention will be understood and appreciated more fully from the following detailed description, taken in conjunction with the drawings in which:

FIG. 2 is a simplified illustration of part of the multi-chip module of FIG. 1 indicated by reference II in FIG. 1, prior to customization thereof;

DETAILED DESCRIPTION OF A PREFERRED EMBODIMENT

Figure 1:
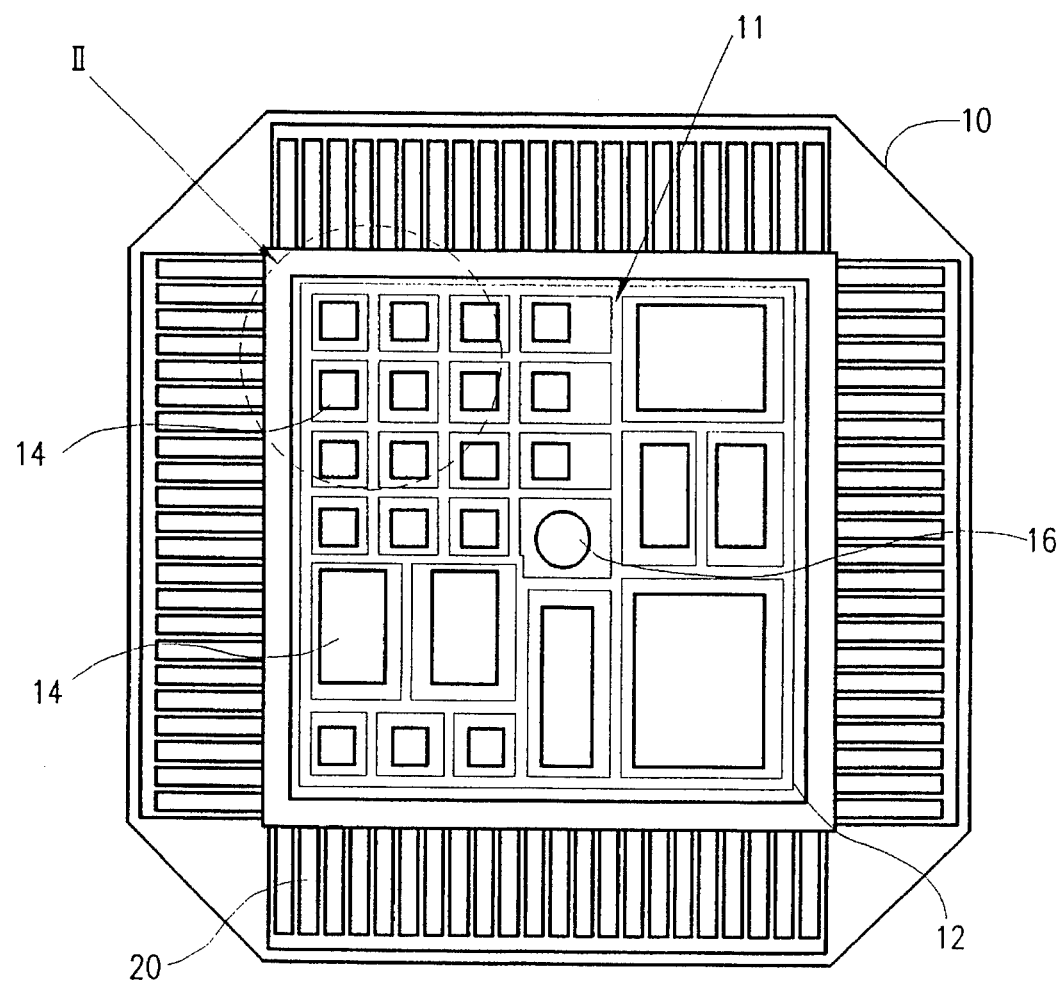
FIG. 1 is a simplified illustration of a multi-chip module constructed and operative in accordance with a preferred embodiment of the present invention.

Reference is now made to FIG. 1, which illustrates a multi-chip module constructed and operative in accordance with a preferred embodiment of the present invention. The multi-chip module comprises a package 10 having formed therein a multi-chip carrier 11 including a substrate 12, which is typically formed of silicon or ceramic. Bonded onto substrate 12 are a plurality of individual chips 14 as well as various passive components, such as capacitors 16, resistors and the like.

In accordance with a preferred embodiment of the invention, the pads of the individual chips are interconnected by personalizable circuitry formed onto substrate 12. This circuitry also connects the pads of the individual chips 14 to the passive components and to a multiplicity of peripheral package leads 20.

Reference is now made to FIG. 2, which illustrates the interconnection circuitry mentioned above. It is seen in FIG. 2 that the interconnection circuitry comprises at least first and second pluralities 22 and 24 of conductors arranged on respective first and second parallel planes. It is seen that the first and second pluralities 22 and 24 of conductors define a grid of conductors arranged over the substrate 12 and define a multiplicity of crossing locations at which conductors of the first and second pluralities cross each other. The crossing locations are identified generally by reference numeral 26.

Figure 3A:
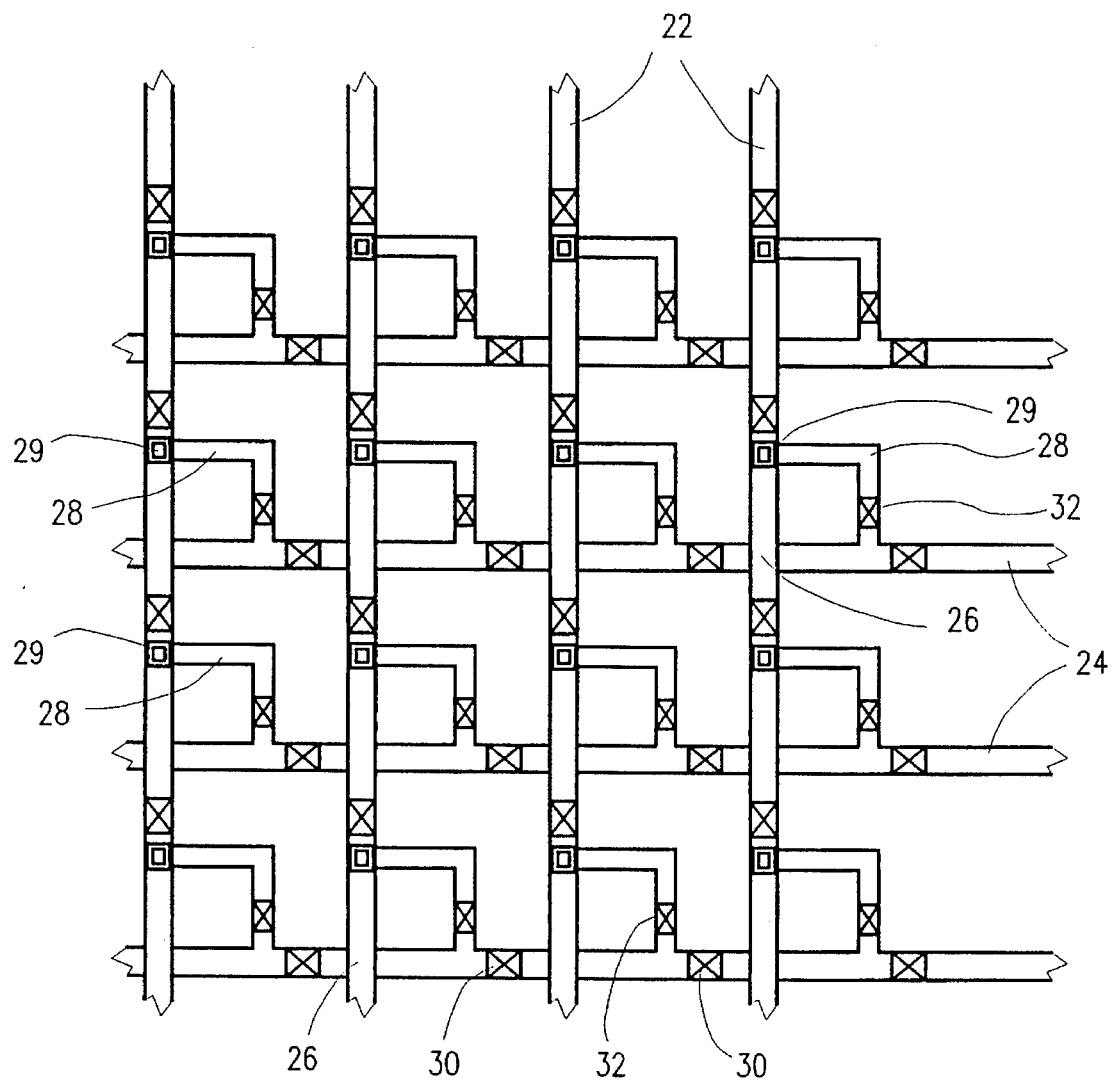
FIGS. 3A and 3B are illustrations of typical interconnections, indicated by reference III in FIG. 2, between pluralities of conductors lying in parallel planes in accordance with a preferred embodiment of the present invention respectively prior to and subsequent to customization.
Figure 3B:
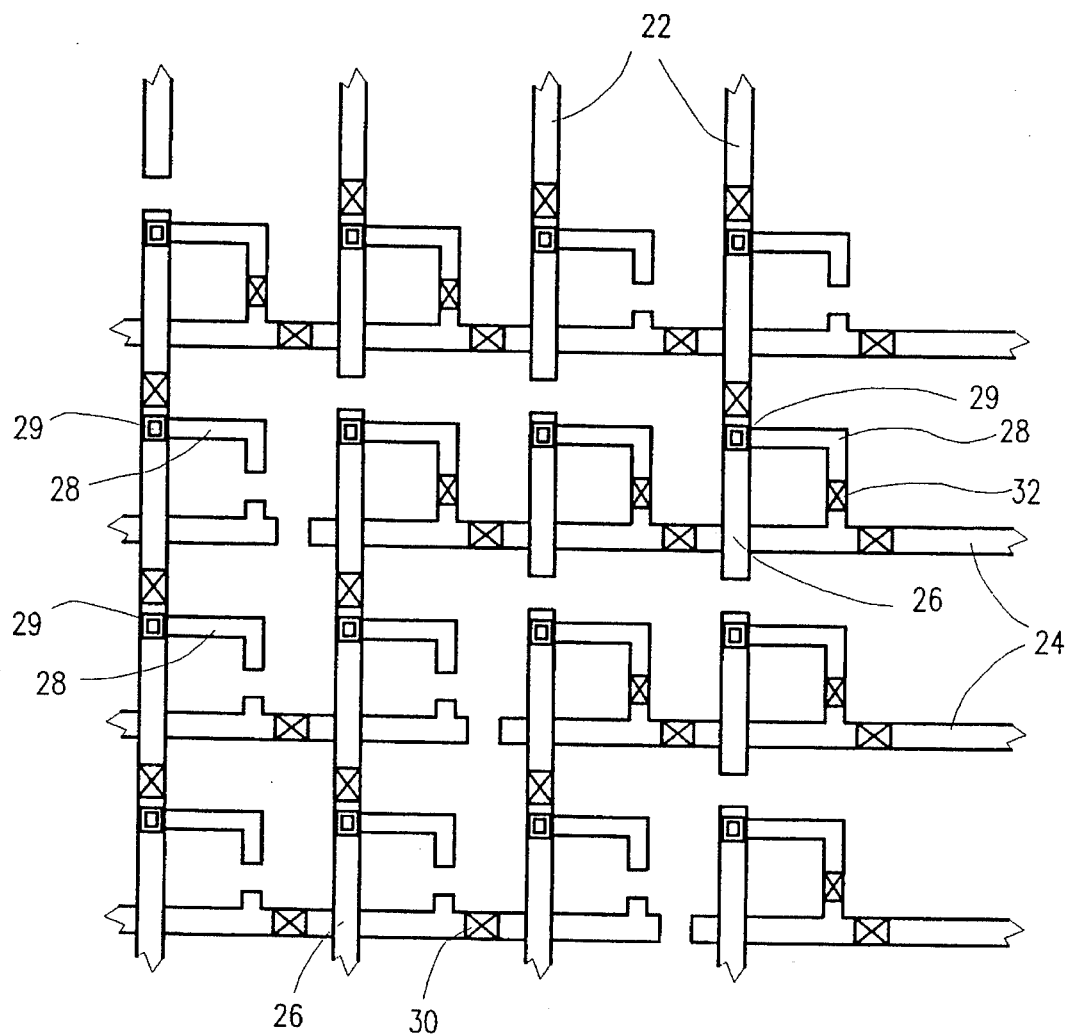

Reference is now additionally made to FIGS. 3A and 3B, which illustrate apparatus for interconnecting the first and second pluralities 22 and 24 of conductors at locations adjacent the multiplicity of crossing locations 26. The apparatus for interconnecting preferably includes a branch connection 28 and a via 29.

In accordance with a preferred embodiment of the invention, a first selectably removable fuse 30 is formed on at least one of the first and second pluralities 22 and 24 of conductors adjacent each of the multiplicity of crossing locations. Additional selectably removable fuses 32 may be formed on each branch connection 28.

Additionally in accordance with a preferred embodiment of the present invention and as shown in FIG. 2, there are provided a third plurality of chip connection pads 34 located alongside at least one of the first and second pluralities 22 and 24 of conductors.

As seen particularly in FIG. 2, there is provided a fourth plurality 36 of electrical connectors connecting each of the third plurality of chip connection pads 34 to a fifth plurality 38 of conductors forming part of the grid of conductors.

Figure 4B:
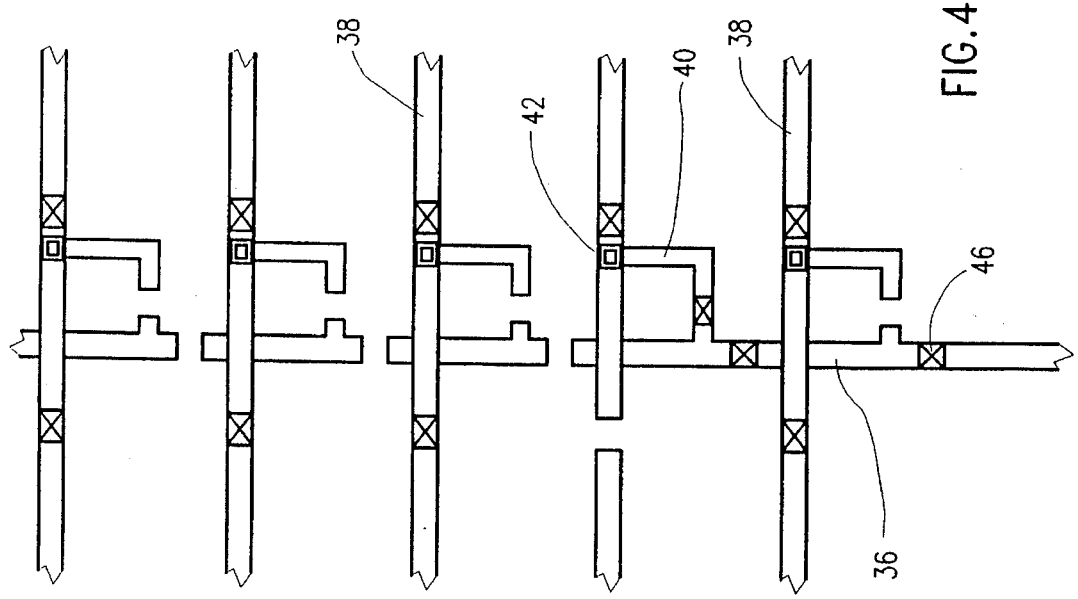
FIGS. 4A and 4B are illustrations of typical interconnections, indicated by reference IV in FIG. 2, between chip pads and conductors lying in parallel planes in accordance with a preferred embodiment of the present invention respectively prior to and subsequent to customization.
Figure 4A:
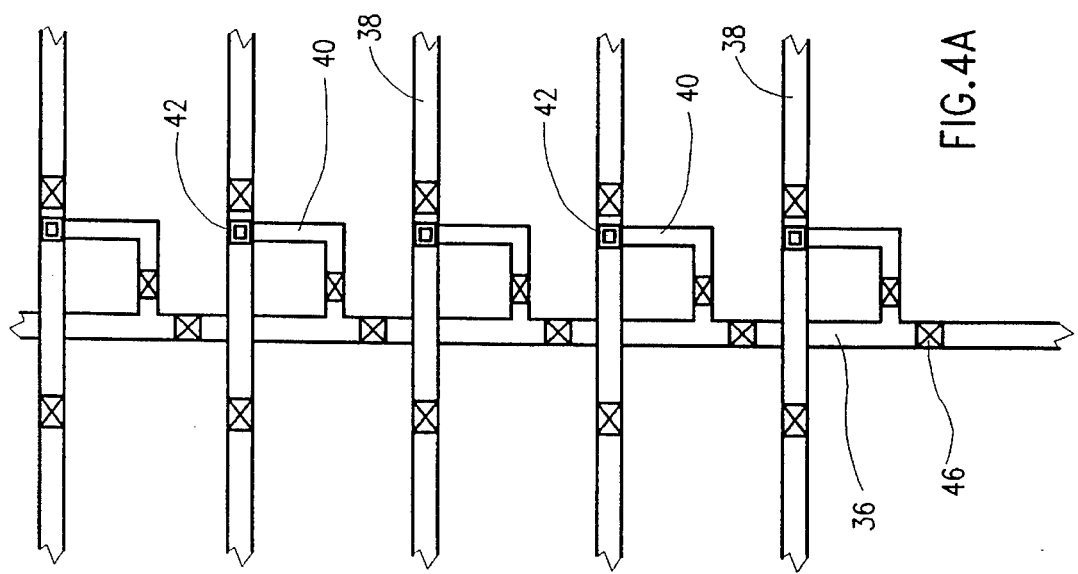

The interconnection between electric connectors 36 and conductors 38 is shown according to a preferred embodiment of the invention in FIGS. 4A and 4B respectively before and after a typical personalization step. It is noted that connectors 36 and conductors 38 typically lie in separate, mutually insulated planes and are typically connected via branch connections 40 and vias 42.

In accordance with a preferred embodiment of the present invention a second selectably removable fuse 46 is provided between each of the fourth plurality of electrical connectors 36 and each of the third plurality of chip connection pads 34.

Figure 5:
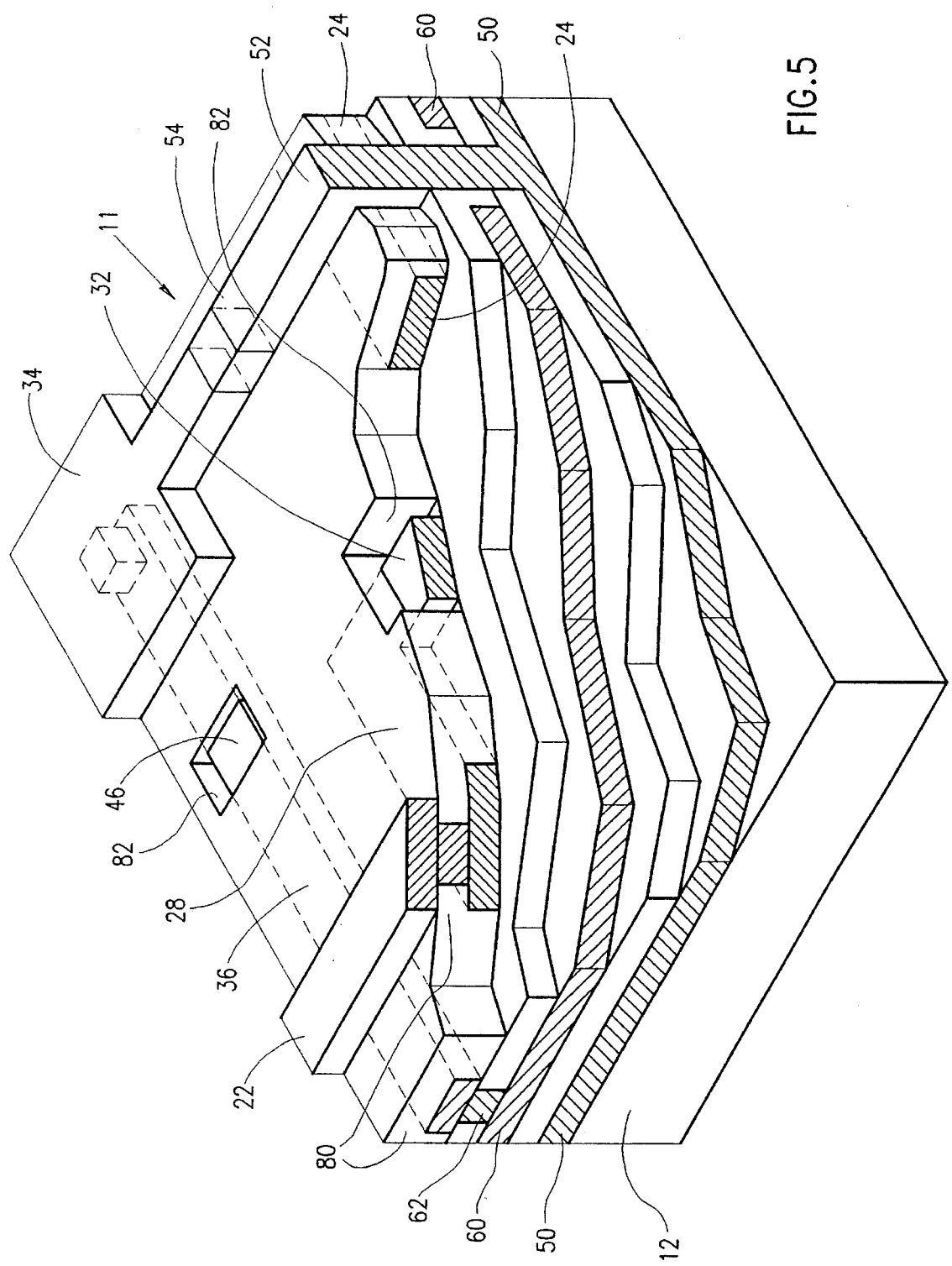
FIG. 5 is a simplified, partially cut-away illustration of part of a multi-chip carrier forming part of the module of FIG. 1, prior to customization thereof.

Reference is now made additionally to FIG. 5, which illustrates part of the chip carrier 11 of FIG. 1 prior to customization thereof. The structure described hereinabove is illustrated in FIG. 5 by corresponding reference numerals.

It is seen in FIG. 5 that the multi-chip carrier 11 also includes a ground plane 50 disposed over the substrate 12 and in a plane parallel to, different from and electrically insulated from the first and second parallel planes containing conductors 22 and 24 respectively. The multi-chip carrier 11 also includes apparatus 52 for conductively connecting the ground plane 50 to some of the third plurality of chip connection pads 34.

Additionally in accordance with a preferred embodiment of the present invention, the multi-chip carrier 11 also includes a third selectably removable fuse 54 disposed along the apparatus 52 for conductively connecting the ground plane 50 to some of the third plurality of chip connection pads 34.

In accordance with a preferred embodiment of the invention, the multi-chip carrier 11 also includes a power plane 60 disposed over the substrate 12 and in a plane parallel to, different from and electrically insulated from the first and second parallel planes containing conductors 22 and 24 respectively and apparatus 62 for conductively connecting the power plane to some of the third plurality of chip connection pads.

Further in accordance with a preferred embodiment of the invention, the multi-chip carrier 11 also includes a sixth plurality of lead connection pads 70 (FIG. 2) adjacent at least one of the first and second pluralities of conductors 22 and 24 and a seventh plurality of electrical connectors 72 connecting each of the sixth plurality of lead connection pads 70 to an eighth plurality of conductors 74 forming part of the grid of conductors. The structure shown in FIGS. 4A and 4B is equally applicable to the interconnection of connectors 72 and conductors 74.

It is appreciated that further in accordance with a preferred embodiment of the present invention the multi-chip carrier blank, such as that partially illustrated in FIG. 5, has at least a first metal layer and a second metal layer formed over the first metal layer and separated therefrom by an insulator, such as that illustrated at reference numeral 80, the first and second metal layers including chip connection pads 34 and conductor grids 22 and 24 and portions, such as fuses 32 and 46, arranged for selectable removal to provide desired customization of the blank, the insulator being formed with openings, such as opening 82 overlying regions of the first metal layer to be selectably removed.

The blank shown in FIG. 5 may be personalized by the use of a laser or by means of chemical etchings. Techniques suitable for such personalization are described and claimed in applicant/assignee's U.S. Pat. Nos. 5,111,273; 5,049,969; and 4,933,738, the disclosure of which is hereby incorporated by reference. FIGS. 3B and 4B illustrate typical portions of the blank of FIG. 5, following such personalization.

It is appreciated that although the interconnections in FIG. 2 are shown only next to the chip locations 14, they may also pass underneath the chips.

It will be appreciated by persons skilled in the art that the present invention is not limited by what has been particularly shown and described hereinabove. Rather the scope of the present invention is defined only by the claims which follow:

What is claimed is:

1. A personalizable multi-chip carrier comprising:

a substrate;

first and second pluralities of conductors arranged on respective first and second parallel planes, said first and second pluralities of conductors defining a grid of conductors arranged over said substrate and defining a multiplicity of crossing locations at which conductors of said first and second pluralities cross each other;

means for interconnecting said first and second pluralities of conductors at locations adjacent said multiplicity of crossing locations;

a first selectably removable fuse formed on at least one of said first and second pluralities of conductors adjacent each of said multiplicity of crossing locations;

a first plurality of chip connection pads located alongside at least one of said first and second plurality of conductors;

a first plurality of electrical connectors connecting each of said first plurality of chip connection pads to a third plurality of conductors forming part of said grid of conductors;

a second selectably removable fuse between each of said first plurality of electrical connectors and each of said first plurality of chip connection pads;

a first plurality of lead connection pads adjacent at least one of said first and second pluralities of conductors; and a second plurality of electrical connectors connecting each of said first plurality of lead connection pads to a fourth plurality of conductors forming part of said grid of conductors.

2. A personalizable multi-chip carrier according to claim 1 and also comprising a ground plane disposed over said substrate and in a plane parallel to, different from and electrically insulated from said first and second parallel planes and means for conductively connecting said ground plane to some of said first plurality of chip connection pads.

3. A personalizable multi-chip carrier according to claim 2 and also comprising a third selectably removable fuse disposed along said means for conductively connecting said ground plane to some of said third plurality of chip connection pads.

4. A personalizable multi-chip carrier according to claim 1 and also comprising a power plane disposed over said substrate and in a plane parallel to, different from and electrically insulated from said first and second parallel planes and means for conductively connecting said power plane to some of said third plurality of chip connection pads.

5. A multi-chip module comprising:

a substrate;

first and second pluralities of conductors arranged on respective first and second parallel planes, said first and second pluralities of conductors defining a grid of conductors arranged over said substrate and defining a multiplicity of crossing locations at which conductors of said first and second pluralities cross each other;

means for interconnecting said first and second pluralities of conductors at locations adjacent said multiplicity of crossing locations;

a first selectably removable fuse formed on at least one of said first and second pluralities of conductors adjacent each of said multiplicity of crossing locations;

a first plurality of chip connection pads located alongside at least one of said first and second plurality of conductors;

a first plurality of electrical connectors connecting each of said first plurality of chip connection pads to a third plurality of conductors forming part of said grid of conductors;

a second selectably removable fuse between each of said first plurality of electrical connectors and each of said first plurality of chip connection pads;

a plurality of chips bonded to said substrate in electrical connection with said first plurality of chip connection pads;

packaging partially surrounding said multi-chip carrier and said plurality of chips;

a first plurality of lead connection pads adjacent at least one of said first and second pluralities of conductors; and a second plurality of electrical connectors connecting each of said first plurality of lead connection pads to a fourth plurality of conductors forming part of said grid of conductors.

* * * * *